United States Patent [19]

Schädeli et al.

[11] Patent Number: 5,558,978

[45] Date of Patent: Sep. 24, 1996

[54] PHOTORESIST COMPOSITIONS CONTAINING COPOLYMERS HAVING ACID-LABILE GROUPS AND RECURRING UNITS DERIVED FROM EITHER N-(HYDROXYMETHYL)MALEIMIDE OR N-(ACETOXYMETHYL)MALEIMIDE OR BOTH

[75] Inventors: Ulrich Schädeli, Plasselb, Switzerland; Norbert Münzel, Heitersheim, Germany; Christoph De Leo, Ehrenkirchen, Germany; Heinz Holzwarth, Bad Krozingen, Germany; Eric Tinguely, Fribourg, Switzerland

[73] Assignee: OCG Microelectronic Materials, Inc., Norwalk, Conn.

[21] Appl. No.: 358,131

[22] Filed: Dec. 16, 1994

[30] Foreign Application Priority Data

Dec. 21, 1993 [CH] Switzerland ................. 279/94

[51] Int. Cl.$^6$ .................................. G03C 1/73
[52] U.S. Cl. .................. 430/270.1; 430/326; 430/906; 430/910
[58] Field of Search .................. 430/270, 326, 430/906, 910

[56] References Cited

U.S. PATENT DOCUMENTS

| | | | |
|---|---|---|---|
| 4,439,517 | 3/1984 | Irving | 430/328 |
| 4,618,564 | 10/1986 | Demmer et al. | 430/270 |
| 5,069,997 | 12/1991 | Schwalm et al. | 430/270 |
| 5,118,585 | 6/1992 | Schwalm et al. | 430/326 |
| 5,210,003 | 5/1993 | Schädeli | 430/270 |

FOREIGN PATENT DOCUMENTS

| | | |
|---|---|---|
| 0085024 | 8/1983 | European Pat. Off. |
| 0166682 | 1/1986 | European Pat. Off. |
| 0254853 | 2/1988 | European Pat. Off. |
| 0264908 | 4/1988 | European Pat. Off. |
| 0318649 | 6/1989 | European Pat. Off. |
| 0329610 | 8/1989 | European Pat. Off. |
| 0342498 | 11/1989 | European Pat. Off. |
| 0366590 | 5/1990 | European Pat. Off. |
| 0410794 | 1/1991 | European Pat. Off. |
| 0475903 | 3/1992 | European Pat. Off. |
| 0476865 | 3/1992 | European Pat. Off. |
| 0541112 | 5/1993 | European Pat. Off. |
| 60-80724 | 3/1994 | Japan . |
| 1539192 | 1/1979 | United Kingdom . |

OTHER PUBLICATIONS

C. A. vol. 111, 105813f (1989).
R. V. Christian, Jr., J. Am. Chem. Soc. 74 (1952) pp. 1591 & 1592.
Comprehensive Organic Synthesis, vol. 4, 1st. Edition 1991, Pergamon Press Oxford pp. 843–848.
S. Sandler, et al, "Polymer Synthesis" vol. 1, pp. 3–21, 1992, Academic Press, New York.
D. J. H. Funhoff, et al. "Deep–UV Resists with Improved delay capacities", SPIE vol. 1672 pp. 46–55 (1992).

Primary Examiner—George F. Lesmes
Assistant Examiner—Laura Weiner
Attorney, Agent, or Firm—William A. Simons

[57] ABSTRACT

The invention relates to novel maleimide copolymers which, in addition to structural units derived from certain maleimide derivatives defined more precisely in the present patent application, comprises recurring structural units selected from the structural units of the formulae (Ia) and (Ib)

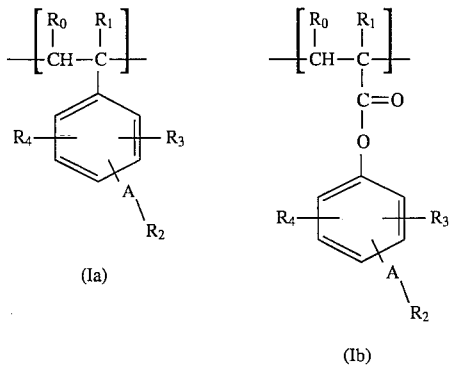

where

A is a direct single bond or a divalent group of the formula —O—;

$R_0$ and $R_1$, independently of one another, are each a hydrogen atom, a $C_1$–$C_6$alkyl group or an aryl group having 6 to 14 ring carbon atoms;

$R_2$ is a radical of the formula

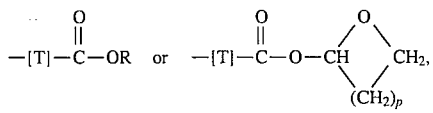

in which

R is a tert-alkyl radical having 4 to 19 carbon atoms,

[T] is a $C_1$–$C_6$alkylene group or an arylene group having 6 to 14 ring carbon atoms, and p is the number 2, 3 or 4; or A together with $R_2$ is a group of the formula

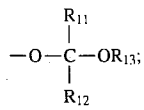

and where, furthermore, $R_3$ and $R_4$, independently of one another, are each a hydrogen atom, a halogen atom, a $C_1$–$C_6$alkyl group or a $C_1$–$C_6$alkoxy group, and the other radicals have specific meanings defined more precisely in the present application. The polymers can form the basis of chemically amplified positive photoresists which exhibit, inter alia, excellent contrast behavior, a low shrinkage tendency in the irradiated areas and insignificant delay time effects.

11 Claims, No Drawings

PHOTORESIST COMPOSITIONS CONTAINING COPOLYMERS HAVING ACID-LABILE GROUPS AND RECURRING UNITS DERIVED FROM EITHER N-(HYDROXYMETHYL)MALEIMIDE OR N-(ACETOXYMETHYL)MALEIMIDE OR BOTH

The present invention relates to polymers based on certain styrene derivatives and/or phenyl (meth)acrylate derivatives as well as maleimide derivatives, to radiation-sensitive compositions comprising these polymers which can be employed as positive photoresists, to a process for the treatment of a substrate using these compositions, and to a process for the production of electronic components which includes the abovementioned process.

EP-A 410 794 has already described negative photoresists for radiation in the deep UV region, i.e. for radiation having a wavelength of about 200–300 nm, which comprise certain polymers based on styrene and maleimide derivatives. These negative resists can be developed in aqueous/alkaline media. However, negative resists are generally less suitable for imaging certain geometrical structures than positive resists, for example for imaging equidistant lines or interstices or contact holes.

Chemically amplified positive photoresists based on specific substituted polystyrenes, which can also comprise recurring structural units of the formula (Ia) mentioned below, are described in EP-A-0 476 865. However, the polymers used therein have, inter alia, an excessively low glass transition temperature and poor thermal flow behaviour. Furthermore, the spatial proximity of phenolic OH groups and the structural units of the formula (Ia) can easily cause premature removal of the acid-labile groups on these structural units, for example even during application and drying of the resist coating or during interim storage of resist-coated, but as yet unexposed material, so that advantageous use of a photoresist based on these polymers is only possible under relatively restricted process conditions. This is disadvantageous, inter alia, since the restricted process latitude of the resist can force a potential user to make substantial changes to an already-introduced procedure in order to adapt to the new resist.

The present invention relates to polymers comprising recurring structural units selected from the structural units of the formulae (Ia) and (Ib)

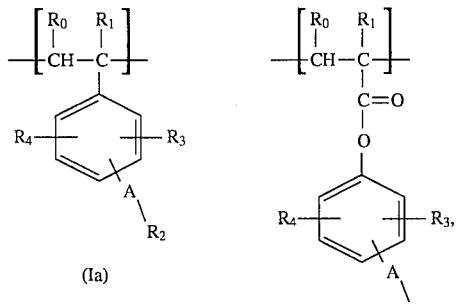

and, in addition to these structural units, recurring structural units of the formula (II)

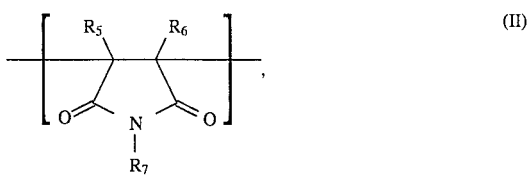

where

A is a direct single bond or a divalent group of the formula —O—;

$R_0$ and $R_1$, independently of one another, are each a hydrogen atom, a $C_1$–$C_6$alkyl group or an aryl group having 6 to 14 ring carbon atoms;

$R_2$ is a radical of the formula

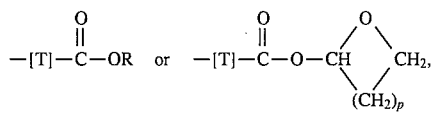

in which

[T] is a $C_1$–$C_6$alkylene group or an arylene group having 6 to 14 ring carbon atoms, R is a tert-alkyl radical having 4 to 19 carbon atoms or a group of the formula

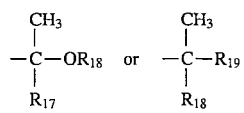

and p is the number 2, 3 or 4; or

A together with $R_2$ is a group of the formula

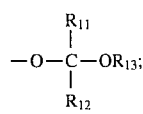

and where, furthermore, $R_3$ and $R_4$, independently of one another, are each a hydrogen atom, a halogen atom, a $C_1$–$C_6$alkyl group or a $C_1$–$C_6$alkoxy group;

$R_5$ and $R_6$, independently of one another, are each a hydrogen atom, a $C_1$–$C_6$alkyl group or an aryl group having 6 to 14 ring carbon atoms, and $R_7$ is a hydrogen atom, a hydroxyl group, a trialkylsilyl group, a $C_1$–$C_6$alkyl group, an aryl group having 6 to 14 ring carbon atoms or a group of the formula —[G]—O—$R_8$, in which

[G] is a $C_1$–$C_6$alkylene group or an arylene group having 6 to 14 ring carbon atoms, and $R_8$ is a hydrogen atom, a trialkylsilyl group or a radical of the formula

in which $R_9$ is a hydrogen atom or a methyl group, or $R_7$ is a group of the formula

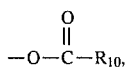

in which $R_{10}$ is a $C_1$–$C_6$alkyl group or an aryl group having 6 to 14 ring carbon atoms;

$R_{11}$ and $R_{12}$, independently of one another, are each a hydrogen atom, a $C_1$–$C_6$alkyl group, a cycloalkyl group having 3 to 6 ring carbon atoms or an aryl group having 6 to 10 ring carbon atoms, where aryl groups are either unsubstituted or have one or more substituents selected from halogen atoms, in particular Cl and Br, $C_1$–$C_4$alkyl and $C_1$–$C_4$alkoxy groups and —CN and —NO$_2$;

$R_{13}$ is a $C_1$–$C_6$alkyl group, a cycloalkyl group having 3 to 6 ring carbon atoms or an aryl group having 6 to 10 ring carbon atoms, where aryl groups are either unsubstituted or have one or more substituents selected from halogen atoms, in particular Cl and Br, $C_1$–$C_4$alkyl and $C_1$–$C_4$alkoxy groups and —CN and —NO$_2$; and $R_{17}$ is a hydrogen atom or a $C_1$–$C_4$alkyl group;

$R_{18}$ is a $C_1$–$C_6$alkyl group or a $C_3$–$C_6$cycloalkyl group, and $R_{19}$ is an aryl group having 6 to 14 ring carbon atoms.

The novel polymers do not have the abovementioned disadvantages of the polymers used hitherto for chemically amplified positive photoresists. In addition, the positive photoresists based on these polymers have a particularly large solubility difference between irradiated and unirradiated material and thus have excellent contrast behaviour. Furthermore, the relatively low shrinkage tendency of the irradiated areas means that chemically amplified positive photoresists based on the novel polymers result in very dimensionally accurate and reproducible relief structures. Furthermore, the resists exhibit virtually no delay time effects, i.e. they give mask-faithful relief structures with vertical walls, even in the case of extended periods between irradiation and the thermal aftertreatment which is usually necessary for chemically amplified resists, and do not tend in these cases to form T-shaped profiles, like the resists of the prior art usually do, even in the case of imaging of structures in the submicron region. These "T-tops" on the imaged profiles are probably a consequence of volatile bases in the ambient atmosphere, which are preferentially absorbed by the upper region of the exposed resist areas, and have hitherto only been avoidable with the aid of special protective coatings, expensive air filtering, special developers or by addition of certain additives to the resist compositions, as described, for example, by D. J. H. Funhoff, H. Binder and R. Schwalm in "Deep-UV Resists with improved delay capacities", SPIE Vol. 1672 (Adv. Resist Technol. Process.), 46–55 (1992). However, all these measures have certain disadvantages, for example a reduced sensitivity of the photoresists in a disadvantageous manner.

In the novel polymers, alkyl $R_0$, $R_1$, $R_5$, $R_6$, $R_7$, $R_{10}$, $R_{11}$, $R_{12}$, $R_{13}$, $R_{17}$ and $R_{18}$ and alkyl and alkoxy $R_3$ and $R_4$ may be straight-chain or branched. Examples which may be mentioned are: methyl, ethyl, n-propyl, i-propyl, n-butyl, sec-butyl, tert-butyl, n-pentyl, neopentyl, n-hexyl, methoxy, ethoxy, n-propoxy, i-propoxy, n-butoxy, sec-butoxy, tert-butoxy, n-pentoxy, neopentoxy and n-hexoxy.

Aryl groups having 6 to 14 ring carbon atoms as $R_0$, $R_1$, $R_5$, $R_6$, $R_7$, $R_{10}$ and $R_{19}$ may be unsubstituted or have one or more substituents, for example $C_1$–$C_6$alkyl, $C_1$–$C_6$alkoxy or halogen substituents, in particular Cl or Br. Examples of suitable aryl groups are phenyl, tolyl, xylyl, mesityl, naphthyl, anthryl, phenanthryl, fluorenyl and biphenyl. Preference is given in each case to aryl groups having 6 to 10 ring carbon atoms, in particular phenyl and naphthyl.

Aryl $R_{11}$, $R_{12}$ and $R_{13}$ is likewise preferably phenyl or naphthyl.

Halogen $R_3$ and $R_4$ is preferably bromine or chlorine.

R as tert-alkyl having 4 to 19 carbon atoms is preferably a group of the formula

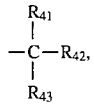

in which the radicals $R_{41}$, $R_{42}$ and $R_{43}$ are identical or different unbranched alkyl groups having 1 to 6, preferably 1 to 4, carbon atoms. Very particularly preferred radicals R are tert-pentyl and in particular tert-butyl.

Trialkylsilyl $R_7$ and $R_8$ is preferably a group of the formula

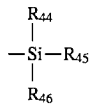

in which the radicals $R_{44}$, $R_{45}$ and $R_{46}$ are identical or different unbranched alkyl groups having 1 to 6, preferably 1 to 4, carbon atoms. In both cases, trialkylsilyl is very particularly preferably trimethylsilyl.

$C_1$–$C_6$Alkylene [T] and [G] may likewise be straight-chain or branched. Examples are methylene, ethylene, propylene, 2,2-propanediol, trimethylene, tetramethylene and hexamethylene.

[T] and [G] as arylene groups having 6 to 14 ring carbon atoms may otherwise be unsubstituted or have one or more substituents, for example $C_1$–$C_6$alkyl, $C_1$–$C_6$alkoxy or halogen substituents. Examples of suitable aryl groups are m-phenylene, p-phenylene, tolylene, for example 2,5-tolylene, xylylene, naphthylene and 4,4'-biphenylene. Preference is given in each case to arylene groups having 6 to 10 ring carbon atoms, in particular phenylene and naphthylene.

Novel polymers comprising structural units of the formula (Ia) and/or of the formula (Ib) containing radicals of the formula

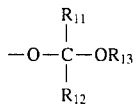

or in particular of the formula

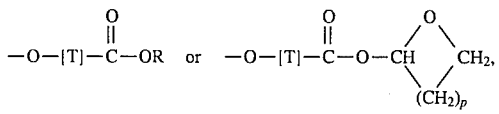

where the other symbols are as defined above, are particularly preferred.

In addition to the recurring structural units of the abovementioned formulae (Ia), (Ib) and (II), the polymers may also contain, in their polymer skeleton, other structural units obtainable from a monomer having a polymerizable double bond by polymerization via this double bond. These other structural units generally comprise up to 50 mol % of the recurring structural units of the polymers. If the novel polymers are employed as a polymer component of a chemically amplified positive photoresist, however, it is important that the polymers only contain sufficient of the additional structural units so that the resist based on them is insoluble in the aqueous/alkaline solutions usually used as developer in the unirradiated state, but 100% soluble in the irradiated state. This can of course vary depending on the type of structural units, but the suitability of a polymer additionally containing other structural units can easily be checked experimentally. Polymers which may be mentioned by way of example of polymers of this type are those which, in addition to the structural units of the formulae (Ia) and/or (Ib) and (II), also contain recurring structural units of the formula (III)

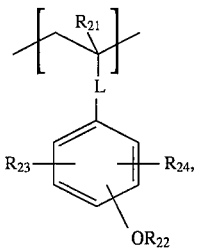

(III)

in which $R_{21}$ is hydrogen or methyl;

L is a direct bond or a divalent radical of the formula

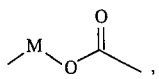

in which

M is a $C_1$–$C_6$alkylene group bonded to the phenyl ring, $OR_{22}$ is an acid-labile radical in which $R_{22}$ is $C_4$–$C_{10}$tert-alkyl, unsubstituted or mono- or poly-$C_1$–$C_6$alkyl—, —$C_1$–$C_6$alkoxy- or -halogen-substituted allyl, cyclohex-2-enyl, $C_6$–$C_{14}$aryl or $C_7$–$C_{16}$aralkyl, trialkylsilyl, or a group of the following formulae

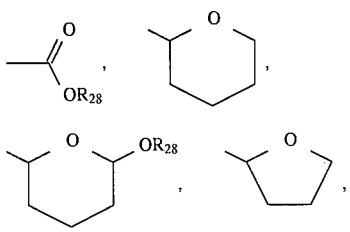

in which $R_{28}$ is $C_1$–$C_6$alkyl or unsubstituted or mono- or poly-$C_1$–$C_6$alkyl—, —$C_1$–$C_6$alkoxy- or -halogen-substituted $C_6$–$C_{14}$aryl or $C_7$–$C_{16}$aralkyl, and $R_{23}$ and $R_{24}$, independently of one another, are hydrogen, $C_1$–$C_6$alkyl groups, $C_1$–$C_6$alkoxy groups or halogen atoms.

However, preference is given to novel polymers which contain only recurring structural units of the formulae (Ia), (Ib) and (II), very particularly polymers consisting of recurring structural units of the formula (Ia) and of the formula (II). Particular preference is given to those of these polymers in which A is the —O— group;

$R_0$ is a hydrogen atom and $R_1$ is a hydrogen atom or a $C_1$–$C_6$alkyl group;

$R_2$ is a radical of the formula

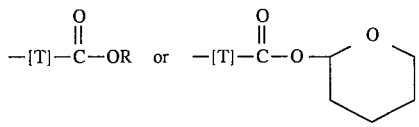

in which

R is a tert-alkyl radical having 4 to 19, in particular 4 to 10, carbon atoms, and

[T] is a $C_1$–$C_6$alkylene group;

$R_3$ and $R_4$, and $R_5$ and $R_6$, independently of one another, are in each case a hydrogen atom or a $C_1$–$C_6$alkyl group; and $R_7$ is a hydrogen atom, a hydroxyl group, a $C_1$–$C_6$alkyl group, an aryl group having 6 to 10 ring carbon atoms or a group of the formula —[G]—O—$R_8$ in which

[G] is a $C_1$–$C_6$alkylene group or an arylene group having 6 ring carbon atoms, and $R_8$ is a hydrogen atom, a trimethylsilyl group or the

radical, in particular those of the last-mentioned polymers in which $R_1$ is a hydrogen atom;

$R_2$ is a radical of the formula

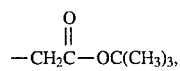

$R_3$ and $R_4$, and $R_5$ and $R_6$ are a hydrogen atom, and $R_7$ is a hydrogen atom, a $C_1$–$C_6$alkyl group, a phenyl group, —$CH_2OH$ or

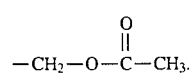

The novel polymers expediently have a molecular weight (weight average) $M_w$ of from 1000 to 1,000,000, preferably from 5000 to 500,000, measured by gel permeation chromatography. A molecular weight of from 10,000 to 100,000, for example about 20,000, usually proves particularly advantageous.

Furthermore, the numerical ratio between structural units of the formulae (Ia) and (Ib) and structural units of the formula (II) in the molecule of novel polymers is expediently on average from 5:1 to 1:1. Apart from polymers prepared using an excess of styrene monomer, maleimide and styrene structural units generally alternate in the polymer skeleton. The use of an excess of maleimide monomers relative to the styrene monomer employed should be avoided since the excess of maleimide generally does not react any further.

A novel polymer having particularly favourable properties is built up, for example, from N-(acetoxymethyl)maleimide and N-hydroxymethylmaleimide as maleimide monomers.

The novel polymers can be prepared in a known manner by free-radical copolymerization of compounds of the formula ($M_{Ia}$) and/or compounds of the formula ($M_{Ib}$)

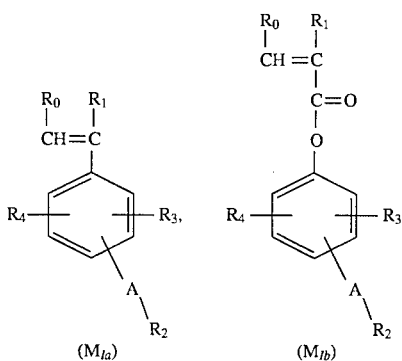

together with compounds of the formula ($M_{II}$)

and, if desired, further monomers containing a polymerizable double bond. In these formulae, $R_0$ to $R_7$ and A are each as defined above.

The free-radical copolymerization can be carded out either thermally or with radiation induction using various methods. Examples of suitable polymerization reactions are described, for example, in S. Sandler and W. Karo "Polymer Synthesis", Vol. 1, pp. 3–17, 1968, Academic Press, New York. Examples of conventional polymerization processes are bulk and solvent polymerization, furthermore emulsion, suspension and precipitation polymerization.

Some of the starting materials of the formulae ($M_{Ia}$), ($M_{Ib}$) and ($M_{II}$) are known and can be prepared by known methods or analogously thereto.

The compounds of the formula ($M_{Ia}$), in which A is an oxygen bridge can be obtained, for example, in the method described in EP-A-0 476 865 by reacting a corresponding hydroxystyrene monomer with a compound of the formula $R_2$(Hal) in the presence of a base, where $R_2$ is again as defined above and Hal is a chlorine or bromine atom. The compounds of the formula ($M_{Ib}$) in which A is an oxygen bridge can be prepared, inter alia, in a likewise known manner by esterification of the desired (meth)acrylic acid derivative of the formula $R_0$—CH=C($R_1$)—COOH using phenols of the formula

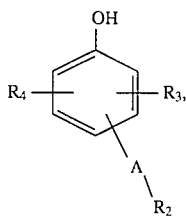

where the phenols are obtainable, for example, analogously to the above preparation method for compounds of the formula ($M_{Ia}$).

If A in the formula ($M_{Ia}$) is a direct bond, the corresponding monomers are obtainable, inter alia, in the following manner, where formula symbols used above are in each case as defined there:

The starting material is a compound of the formula

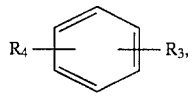

which is reacted with a lactone of the formula

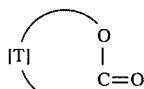

under Friedel-Crafts conditions in the presence of, for example, $AlCl_3$ analogously to the procedure of R. V. Christian jr., J. Am. Chem. Soc. 74 (1952), pages 1591 and 1592, to give a product of the formula

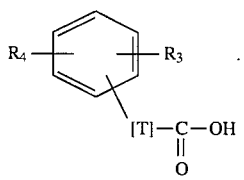

This is then, for example, either esterified using an alcohol of the formula R—OH or reacted with a compound of the formula

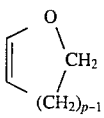

in acidic solution, depending on whether $R_2$ in the formula ($M_{Ia}$) is to be a radical of the formula

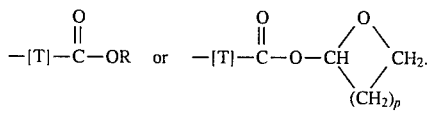

The product is then brominated on the phenyl ring in a conventional manner, and the resultant compound of the formula

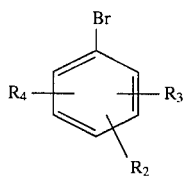

is reacted further with an alkene compound of the formula $R_0$-CH=CH-$R_1$ in a likewise known manner in the presence of a suitable palladium(O) catalyst and in the presence of a base to give the monomer of the formula ($M_{Ia}$), as described, for example, in COMPREHENSIVE ORGANIC SYNTHESIS, Vol. 4, 1st Edition 1991, Pergamon Press, Oxford.N.Y. Seoul.Tokyo, pp. 843–848.

If A in the formula ($M_{1b}$) is a direct bond, the corresponding monomers are obtainable, for example, starting from a compound of the formula

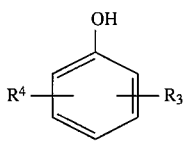

by reaction with the corresponding lactone and an alcohol of the formula R—OH or a compound of the formula

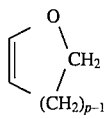

analogously to the procedure outlined above, followed by reaction of the resultant product with the desired (meth-)acrylic acid derivative of the formula $R_0$—CH=C($R_1$)—COOH.

Processes for the preparation of monomers of the formulae $M_{Ia}$ and $M_{Ib}$ in which A together with $R_2$ is a group of the formula

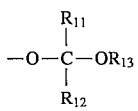

are likewise known to the person skilled in the art. A large number of various generally applicable processes are described, for example, in Houben-Weyl, "Methoden der organischen Chemie" [Methods of Organic Chemistry], Vol. E14a/1 (O/O/— and O/S—acetals); Georg Thieme Verlag Stuttgart.N.Y. (1991), pp. 1 to 591. For example, halogen/$OR_{13}$ acetals can be reacted with the phenolic precursors of the monomers $M_{(Ia)}$ and $M_{(Ib)}$ in the presence of auxiliary bases, such as tertiary amines (pp. 19 ff. of the above volume of Houben-Weyl). Another very favourable method is the addition reaction of ethers containing in the structural unit $_>C=C_>OR_{13}$, in particular 2-methoxypropene or corresponding vinyl ethers, for example tert-butyl vinyl ether, with phenolic precursors of the monomers $M_{(Ia)}$ or $M_{(Ib)}$ in the presence of acids, for example p-toluenesulfonic acid.

Examples of suitable monomers of the formula ($M_{Ia}$) are 2-(4-vinylphenoxy)-2-methoxypropane, 1-(4-vinylphenoxy)-1-tert-butoxyethane, tert-butyl 4-vinylphenoxyacetate, the corresponding tert-pentyl ester, the tert-butyl and tert-pentyl esters of 4-vinylphenoxypropionic acid and of 4-vinylphenoxybutyfic acid, and the 4-vinylphenoxyacetic, 4-vinylphenoxypropionic and 4-vinylphenoxybutyfic esters of 2-tetrahydrofuranol and 2-tetrahydropyranol. Examples of monomers of the formula ($M_{Ib}$) are the acrylic and methacrylic esters of 4-(tert-butylcarbonylmethyl)phenol and of 4-(2-(tert-butylcarbonyl)ethyl)phenol.

The compounds of the formula ($M_{II}H$) are likewise known or can be prepared by known methods from maleimide or the corresponding maleimide derivatives containing the desired $R_5$ and/or $R_6$ substituents, for example by reacting the maleimide with a halide or a tosylate of the formula LG-$R_7$, in which $R_7$ is as defined above and LG is halogen or $CH_3$—$C_6H_4$—$SO_3$—, in the presence of bases.

The synthesis of N-hydroxymethylmaleimide from maleimide and formaldehyde in the presence of NaOH is described, for example, in EP-A 410 794.

Suitable compounds of the formulae (MH) include N-hydroxymethylmaleimide, N-2-hydroxyethylmaleimide, N-3-hydroxypropylmaleimide, N-4-hydroxybutylmaleimide, N-(2-hydroxyprop-2-yl)maleimide, N-methoxymethylmaleimide, N-phenoxymethylmaleimide, N-benzyloxymethylmaleimide, N-2-methoxyethylmaleimide, N-3-methoxypropylmaleimide, N-4-methoxybutylmaleimide, N-acetoxymethylmaleimide and N-(2-acetoxyethyl)maleimide.

Examples of further comonomers containing polymerizable double bonds which are suitable for the preparation of novel polymers by copolymefization with the monomers of the formulae ($M_{Ia}$), ($M_{Ib}$) and ($M_n$) are 4-tert-butoxystyrene, 4-phenoxystyrene, 4-benzyloxystyrene, 4-trimethylsilyloxystyrene, 4-allyloxystyrene, 4-methallyloxystyrene, 4-(tert-butoxycarbonyloxy)styrene, 4-(2-tetrahydropyranyloxy)styrene, 4-(2-tetrahydrofuranyloxy)styrene, 4-(3-methylbut-2-enyloxy)styrene, 4-(2-tetrahydropyranyloxy)benzyl methacrylate and 4-(2-tetrahydropyranyloxy)benzyl acrylate.

The polymerization is generally initiated by a conventional free-radical initiator. Examples are thermal initiators, such as azo compounds, for example α,α'-azobisisobutyronitrile (AIBN), and peroxides, for example benzoyl peroxide, or redox initiator systems, such as a mixture of iron(III) acetylacetonate, benzoin and benzoyl peroxide, or photochemical free-radical formers, such as benzoin and benzil dimethyl ketal.

The polymerization is preferably carried out in solution. The reaction temperature is generally in the range of from 10° to 200° C., preferably from 40° to 150° C., particularly preferably from 40° to 100° C.

Any solvent present must be inert under the reaction conditions. Suitable solvents include aromatic hydrocarbons, chlorinated hydrocarbons, ketones and ethers. Examples of these are: benzene, toluene, xylenes, ethylbenzene, isopropylbenzene, ethylene chloride, propylene chloride, methylene chloride, chloroform, methyl ethyl ketone, acetone, cyclohexanone, diethyl ether, diglyme and tetrahydrofuran.

The invention furthermore relates to radiation-sensitive compositions comprising a) at least one novel polymer as defined above and b) at least one compound which forms an acid on exposure to actinic radiation.

These compositions can be employed in an advantageous manner, for example, as chemically amplified positive photoresists.

The novel compositions can comprise, as a further component c), a solvent or a solvent mixture.

The novel compositions may furthermore comprise solution inhibitors, which reduce the solubility of the composition in conventional alkaline developers, but are cleaved in the presence of acid in such a way that the reaction products which remain are soluble in the developer. Such solution inhibitors are known to the person skilled in the art and are described, for example, in EP-A 329 610, EP-A 541 112 and EP-A 475 903.

Suitable compounds b) which form an acid on exposure to actinic radiation are, in particular, onium salts, such as diazonium, sulfonium, sulfoxonium and iodonium salts, and disulfones. Preference is given to sulfonium salts of the formula (IV)

in which $Ar_1$ is unsubstituted or halogen-, $C_1$–$C_4$alkyl-, $C_1$–$C_4$alkoxy-, hydroxyl- and/or nitro-substituted phenyl, naphthyl or phenyl-$COCH_2$—, $Z_1$ is $C_1$–$C_6$alkyl or $C_3$–$C_7$cycloalkyl, and $Z_2$ is tetrahydrothienyl, tetrahydrofuryl or hexahydropyryl, q is 0, 1, 2 or 3, r is 0, 1 or 2 and s is 0 or 1, where the sum q+r+s is 3, and $X_1^\ominus$ is a chloride, bromide or iodide anion, $BF_4^\ominus$, $PF_6^\ominus$, $AsF_6^\ominus$, $SbF_6^\ominus$, $FSO^\ominus$ or the anion of an organic sulfonic acid or carboxylic acid.

Phenyl, naphthyl and phenacyl groups $Ar_1$ are preferably monosubstituted, in particular by Cl, Br, methyl, methoxy, —OH or nitro. The radicals are particularly preferably unsubstituted. $Z_1$ is preferably $C_1$–$C_4$alkyl, in particular methyl or ethyl. q is preferably 2 or 3, r is preferably 1 or zero and s is preferably zero, in particular q is 3 and r and s are zero. $Ar_1$ is very particularly preferably unsubstituted phenyl and q is very particularly preferably 3.

$X_1^\ominus$ as the anion of an organic sulfonic acid or carboxylic acid can be the anion of an aliphatic, cycloaliphatic, carbocyclic-aromatic, heterocyclic-aromatic or araliphatic sulfonic or carboxylic acid. These anions may be substituted or unsubstituted. Preference is given to sulfonic and carboxylic acids having low nucleophilicity, for example partially or perfluorinated derivatives or derivatives which are substituted in the position adjacent to the respective acid group. Examples of substituents are halogen, such as chlorine or in particular fluorine, alkyl, such as methyl, ethyl or n-propyl, or alkoxy, such as methoxy, ethoxy or n-propoxy.

Examples of aliphatic sulfonic acids are methane-, ethane-, n-propane-, n-butane- and n-hexanesulfonic acid and the corresponding partially or perfluorinated derivatives.

Examples of aliphatic carboxylic acids are formic acid, acetic acid, propionic acid, butyric acid, pivalic acid, caproic acid, 2-ethylhexylcarboxylic acid and fatty acids, such as lauric acid, myristic acid and stearic acid, and the partially or perfluorinated derivatives of these acids.

Examples of cycloaliphatic sulfonic or carboxylic acids are cyclohexanesulfonic acid, cyclohexanecarboxylic acid, camphor-10-sulfonic acid and the partially or perfluorinated derivatives thereof.

Examples of carbocyclic-aromatic sulfonic acids are benzene-, toluene-ethylbenzene-, isopropylbenzene, dodecylbenzene- and dimethylbenzenesulfonic acid, 2,4,6-triisopropylbenzenesulfonic acid, 2,4,6-trimethylbenzenesulfonic acid, naphthalenemono-, -di- and -trisulfonic acids and the corresponding alkylated or partially or perfluorinated derivatives of these sulfonic acids.

Examples of heterocyclic-aromatic sulfonic acids are pyridine-, thiophene- and pyrrolesulfonic acid and the corresponding partially or perfluorinated derivatives of these acids.

Examples of araliphatic sulfonic acids are benzylsulfonic acid, α-methylbenzylsulfonic acid and the corresponding partially or perfluorinated derivatives of these compounds.

Examples of carbocyclic-aromatic carboxylic acids are benzoic acid, toluene-, ethylbenzene-, isopropylbenzene- and dimethylbenzenecarboxylic acid, naphthalenecarboxylic acid and anthracenecarboxylic acid, and the corresponding partially or perfluorinated derivatives of these compounds.

Examples of heterocyclic-aromatic carboxylic acids are pyridine-, thiophene- and pyrrolecarboxylic acid, and the corresponding partially or perfluorinated derivatives of these compounds.

Examples of araliphatic carboxylic acids are benzylcarboxylic acid, α-methylbenzylcarboxylic acid and cinnamic acid, and the corresponding partially or perfluorianted derivatives of these compounds.

$X_1^\ominus$ is preferably the monovalent anion of an organic sulfonic acid, in particular a partially fluorinated or perfluorinated sulfonic acid. These anions are distinguished by particularly low nucleophilicity.

Specific examples of suitable sulfonium salts of the formula (IV) are triphenylsulfonium bromide, triphenylsulfonium chloride, triphenylsulfonium iodide, triphenylsulfonium hexafluorophosphate, triphenylsulfonium hexafluoroantimonate, triphenylsulfonium hexafluoroarsenate, triphenylsulfonium trifluoromethanesulfonate, diphenylethylsulfonium chloride, phenacyldimethylsulfonium chloride, phenacyltetrahydrothiophenium chloride, 4-nitrophenacyltetrahydrothiophenium chloride and 4-hydroxy-2-methylphenylhexahydrothiopyrylium chloride. Triphenylsulfonium trifluoromethanesulfonate is particularly preferred.

The compounds b) can also be iodonium salts of the formula (V)

$$[Ar_2\text{-}I^{\oplus}\text{-}Ar_3]X_2^\ominus \qquad (V)$$

in which $Ar_2$ and $Ar_3$, independently of one another, are unsubstituted or $C_1$–$C_4$alkyl-, $C_1$–$C_4$alkoxy-, halogen- and/or nitro-substituted phenyl or naphthyl, or $Ar_2$ and $Ar_3$ together are a group of the formula (VI)

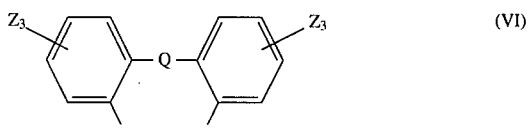

in which $Z_3$ is $C_1$–$C_4$alkyl, $C_1$–$C_4$alkoxy, halogen or nitro, and Q is a direct bond, —O—, —$CH_2$— or —CO—, and $X_2^\ominus$ is as defined for $X_1^\ominus$ in the formula (IV).

The iodonium salts of the formula (V) are described, for example, in GB-A 1 539 192.

Suitable compounds b) are also substances of the formulae (VII) to (XVI) which generate sulfonic acid on exposure to actinic radiation.

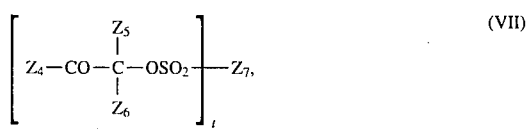

(VII)

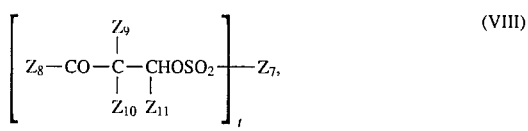

(VIII)

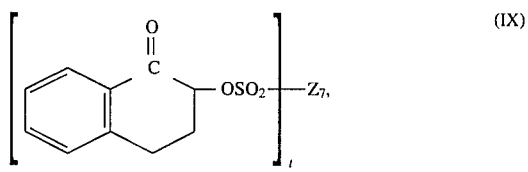

(IX)

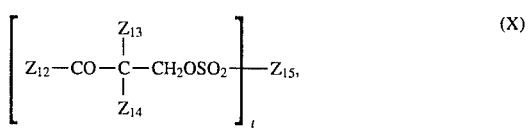

(X)

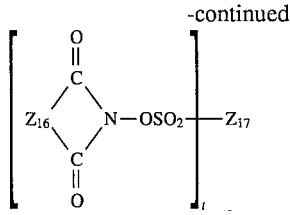  (XI)

[Z₁₈CON(Z₁₄)—OSO₂]ₜZ₁₇,  (XII)

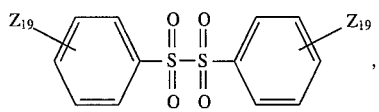  (XIII)

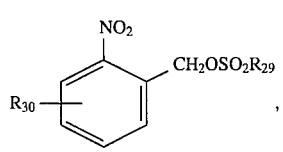  (XIV)

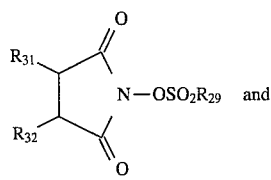  (XV)

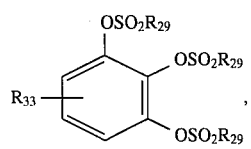  (XVI)

in which t is 1 or 2, preferably 1, $Z_4$ is phenyl or naphthyl, each of which is unsubstituted or substituted by 1 to 3 —Cl, —Br,—CN, —NO₂, $C_1$–$C_4$alkyl, $C_1$–$C_4$alkoxy, $C_1$–$C_4$alkylthio, phenoxy, phenylthio, $C_1$–$C_4$alkylamino, $C_2$–$C_4$dialkylamino or benzoyl, in particular phenyl which is unsubstituted or monosubstituted by Cl, methyl or methoxy, $Z_5$ is hydrogen or $C_1$–$C_4$alkyl, and $Z_6$ is hydrogen, $C_1$–$C_4$alkyl or phenyl, or $Z_5$ and $Z_6$, together with the carbon atom linking them, form a cyclopentane or cyclohexane ring, $Z_7$, in the case where t=1, is $C_1$–$C_{18}$alkyl, unsubstituted or $C_1$–$C_4$alkyl-substituted phenyl or naphthyl, cyclopentyl, cyclohexyl or campheryl or, in the case where t=2, is $C_2$–$C_8$alkylene or phenylene, $Z_8$ is phenyl or naphthyl, each of which is unsubstituted or substituted by 1–3 —Cl, —Br, $C_1$–$C_4$alkyl, $C_1$–$C_4$alkoxy, $C_1$–$C_4$alkylthio, phenyl, phenoxy, phenylthio, $C_1$–$C_4$alkyl—CONH—, benzoylamino or dimethylamino, in particular phenyl which is unsubstituted or monosubstituted by —Cl, $C_1$–$C_4$alkoxy, methylthio or phenyl is —OH or $C_1$–$C_4$alkyl, $Z_{10}$ is $C_1$–$C_4$alkyl or phenyl, $Z_{11}$ is hydrogen, $C_1$–$C_4$alkyl, furyl or —CCl₃, or $Z_{10}$ and $Z_{11}$, together with the carbon atom linking them, form a cyclopentane or cyclohexane ring, $Z_{12}$ and $Z_{13}$, independently of one another, are unsubstituted or halogen-, $C_1$–$C_4$alkylo or $C_1$–$C_4$alkoxy-substituted phenyl, $Z_{14}$ is hydrogen or $C_1$–$C_4$alkyl, $Z_{15}$, in the case where t=1, is $C_1$–$C_6$alkyl, phenyl, naphthyl or benzyl, and, in the case where t=2, is $C_1$–$C_6$alkylene, phenylene or xylylene, $Z_{16}$ is unsubstituted or halogen-, nitro-, $C_1$–$C_4$alkyl-, $C_1$–$C_4$alkoxy- or $C_1$–$C_4$alkylthio-substituted phenylene or naphthylene or is —CH=CH—, $Z_{17}$, in the case where t=1, is unsubstituted or halogen-, nitro-, $C_1$–$C_4$alkyl- or $C_1$–$C_4$alkoxy-substituted $C_1$–$C_{12}$alkyl or unsubstituted or halogen-, nitro-, $C_1$–$C_4$alkyl- or $C_1$–$C_4$alkoxy-substituted phenyl, and, in the case where t=2, is $C_2$–$C_8$alkylene or phenylene, $Z_{18}$ is unsubstituted or halogen-, nitro-, —CN—, $C_1$–$C_4$alkyl-, methoxy-, ethoxy-, dimethylamino- or benzoyl-substituted phenyl or naphthyl, and the $Z_{19}$ radicals, independently of one another, are $C_1$–$C_4$alkyl, $R_{29}$ is unsubstituted or halogen-, nitro-, $C_1$–$C_4$alkyl- or $C_1$–$C_4$alkoxy-substituted $C_1$–$C_{12}$alkyl or unsubstituted or halogen-, nitro-, $C_1$–$C_4$alkyl- or $C_1$–$C_4$alkoxy-substituted phenyl, $R_{30}$ is $C_1$–$C_4$alkyl, $C_1$–$C_4$alkoxy or phenyl, $R_{31}$ and $R_{32}$, independently of one another, are $C_1$–$C_4$alkyl, $C_1$–$C_4$alkoxy or phenyl, or together are a radical of the formulae (XVII), (XVIII) or (XIX)

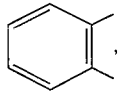  (XVII)

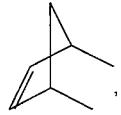  (XVIII)

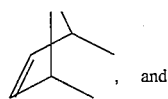  (XIX)

and $R_{33}$ is $C_1$–$C_4$alkyl, $C_1$–$C_4$alkoxy, phenyl or benzoyl.

Alkyl, alkoxy, alkylthio, alkylamino, dialkylamino, alkylcarbamoyl and alkylene groups as defined can be straight-chain or branched, but are preferably straight-chain. Halogen is, in particular, —Cl or —Br.

Compounds of the formulae (VII) to (XVI) are described, for example, in EPoA 0 166 682 and 0 085 024 and the references cited therein. Particularly preferred compounds of the formulae (VII) to (XVI) are phenacyl p-methylbenzenesulfonate, benzoin p-toluenesulfonate, α-(p-toluenesulfonyloxy)methylbenzoin 3-(p-toluenesulfonyloxy)-2-hydroxy-2-phenyl-1-phenylpropyl ether, N-(p-dodecylbenzenesulfonyloxy)-1,8-naphthalimide and N-(phenyl-sulfonyloxy)-1,8-naphthalimide.

Other suitable compounds b) are o-nitrobenzaldehydes which rearrange on actinic irradiation to give o-nitrosobenzoic acids such as 1-nitrobenzaldehyde and 2,6-dinitrobenzaldehyde; a-haloacylphenones, such as α,α,α-trichloroacetophenone and p-tert-butyl-α,α,α-trichloroacetophenone, and sulfonic esters of o-hydroxyacylphenones, such as 2-hydroxybenzophenone methanesulfonate and 2,4-hydroxybenzophenone bis(methanesulfonate).

Finally, suitable compounds b) are also those containing aromatically bonded chlorine or bromine, as described, for example, in EP-A 0 318 649, for example compounds of the formula (XX)

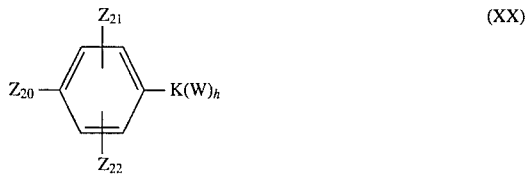

containing at least one aromatically bonded chlorine or bromine atom, in which, for example, p is 0 or 1, $Z_{20}$ is —COOH, —$OZ_{23}$ or —$SZ_{23}$, $Z_{21}$ and $Z_{22}$, independently of one another, are hydrogen, —$C_1$, —Br, unsubstituted or aryl-, alkoxy-, aryloxy-, OH— or F-substituted alkyl or unsubstituted or alkoxy-, aryloxy-, OH— or halogen-substituted aryl, $Z_{23}$ is hydrogen, alkyl or aryl, each of which is unsubstituted or substituted analogously to $Z_{21}$, or acyl, K, in the case where p=0, is hydrogen, —Cl, —Br or alkyl which is unsubstituted or substituted anogously to $Z_{21}$, or, in the case where p=1, is —$SO_2$—, propylene or perfluoroalkylene, and W is a

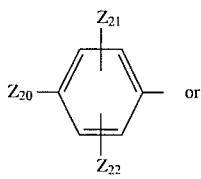

group or alkylcarbonyl, alkoxycarbonyl or substituted sulfonylimidocarbonyl.

Examples of such compounds are hexafluorotetrabromo-bisphenol A, 1,1,1-tris(3,5-dibromo-4-hydroxyphenyl)ethane and N-(2,4,6-tribromophenyl)-N'-(p-toluenesulfonyl)urea The compounds b) are particularly preferably those of the formula (IV) in which $Ar_1$ is phenyl, q is the number 3, r and s are zero, and $X_1^{\ominus}$ is $SbF_6^{\ominus}$, $AsF_6^{\ominus}$, $PF_6^{\ominus}$, $CF_3SO_3^{\ominus}$, $C_2F_5SO_3^{\ominus}$, n-$C_4F_9SO_3^{\ominus}$, n-$C_6F_{13}SO_3^{\ominus}$, n-$C_8F_{17}SO_3^{\ominus}$ or $C_6F_5SO_3^{\ominus}$.

Component b) is very particularly preferably triphenylsulfonium trifluoromethanesulfonate.

The compounds b) are expediently employed in an amount of 0.1–20% by weight, preferably 1–10% by weight, in particular 1–6% by weight, based on the weight of component a).

The novel compositions may comprise further conventional additives, for example stabilizers, pigments, dyes, fillers, adhesion promoters, flow-control agents, wetting agents and plasticizers. For application, the compositions are preferably dissolved in suitable solvents.

Although not necessary, the novel radiation-sensitive compositions may also comprise further polymers, for example as binders. The choice of these binders can be made depending on the area of application and the properties required for this purpose. Examples of suitable binders are novolaks, which are derived from an aldehyde, preferably formaldehyde, acetaldehyde or furfuraldehyde, but particularly from formaldehyde, and a phenol. The phenolic component of these binders is preferably phenol itself, or alternatively halogenated phenol, for example substituted by one or two chlorine atoms, preferably p-chlorophenol, or is a phenol substituted by one or two $C_1$–$C_9$alkyl groups, for example o-, m- or p-cresol, a xylenol, p-tert-butylphenol or p-nonylphenol. The phenol component of the preferred novolaks can be p-phenylphenol, resorcinol, bis(4-hydroxyphenyl)methane or 2,2-bis(4-hydroxyphenyl)propane.

Other suitable binders are, for example, copolymers of maleic anhydride with styrene, vinyl ethers or 1-alkenes. Homopolymeric or copolymeric acrylates and methacrylates, for example copolymers of methyl methacrylate/ethyl acrylate/methacrylic acid, poly(alkyl methacrylates) or poly(alkyl acrylates) having, for example, 1–20 carbon atoms in the alkyl radical, can likewise be used as binder.

One binder is preferably an alkali-soluble substance, for example a novolak (if desired modified as described above), poly(4-hydroxystyrene) or poly(4-hydroxy-3,5-dimethylstyrene), copolymers of maleic anhydride with styrene, vinyl ethers or 1-alkenes, and copolymers of acrylic or methacrylic esters with ethylenically unsaturated acids, for example methacrylic acid or acrylic acid.

The novel radiation-sensitive compositions dissolved in a solvent or solvent mixture are highly suitable as coating compositions for substrates of all types, for example wood, textiles, paper, ceramic, glass, plastics, such as polyester, polyethylene terephthalate, polyolefins or cellulose acetate, in particular in the form of films, and metals, such as Al, Cu, Ni, Fe, Zn, Mg or Co, and GaAs, Si or $SiO_2$, to which an image is to be applied by imagewise exposure.

The choice of solvent and the concentration depend principally on the type of composition and on the coating method. The solvent should be inert, i.e. it should not undergo any chemical reaction with the components and it should be re-removable on drying after coating. Examples of suitable solvents are ketones, ethers and esters, such as methyl ethyl ketone, 2-heptanone, cyclopentanone, cyclohexanone, γ-butyrolactone, ethyl pyruvate, diethylene glycol dimethyl ether, 2-methoxyethanol, 2-ethoxyethanol, 2-ethoxyethyl acetate, 1-methoxy-2-propyl acetate, 1,2-dimethoxy ethane, ethyl acetate and 3-methoxymethyl propionate.

The novel compositions are preferably used as positive photoresists. The invention therefore furthermore relates to a process for treating a substrate which comprises the following process measures in the stated sequence:

1. application of a coating comprising one of the compositions described above to the substrate;
2. imagewise exposure of the coating to actinic radiation;
3. treatment of the coating with a developer based on an aqueous/alkaline solution until the areas of the coating which have been exposed to the radiation detach from the substrate and an imagewise-structured coating remains on the substrate.

The solution is applied uniformly to a substrate by known coating methods, for example by spin-coating, dipping, knife coating, curtain coating, brushing, spraying, particularly by electrostatic spraying, and reverse-roll coating. It is also possible to apply the photosensitive coating to a temporary, flexible support and then to coat the final substrate, for example a coper-laminated circuit board, by transferring the coating by lamination.

The application rate (coating thickness) and the type of substrate (coating support) depend on the desired area of application. The coating thickness range generally covers values of from about 0.1 μm to more than 10 μm.

After the coating operation, the solvent is generally removed by drying, giving a coating of the novel comosition on the support.

The novel radiation-sensitive compositions are suitable as photoresists for electronics (electroplating resist, etch resist or solder resist), for the production of printing plates, such as offset printing plates or screen printing plates, for use in chemical milling or use as microresist in the production of integrated circuits. The possible coating supports and processing conditions of the coated substrates differ accordingly.

Suitable substrates for photographic information recordings are, for example, polyester or cellulose acetate films or plastic-coated papers; specially treated aluminium for offset printing plates, copper-laminated laminates for the production of printed circuits, and silicon wafers for the production of integrated circuits. The coating thicknesses are generally from about 0.5 μm to 10 μm, for photographic materials and offset printing plates and from 0.4 to about 2 μm for printed circuits.

For the production of relief structures, the substrate coated with the novel composition is exposed imagewise. The term 'imagewise' exposure includes both exposure through a photomask containing a predetermined pattern, for example a transparency, exposure by means of a laser beam, which is moved over the surface of the coated substrate, for example under computer control, thus generating an image, exposure by means of computer-controlled electron beams, and exposure by means of X-rays or UV rays through a corresponding mask.

Radiation sources which can be used are in principle all lamps which emit radiation in the UV region. Both pointlight sources and spread emitters (lamp carpets) are suitable. Examples are: carbon arc lamps, xenon arc lamps, mercury vapour lamps, if desired doped with metal halides (metal halogen lamps), fluorescent lamps, argon incandescent lamps, electronic flash lamps, photographic floodlamps, electron beams and X-rays. The distance between the lamp and the novel image material can vary depending on application and lamp type and strength, for example between 2 cm and 150 cm. Particularly suitable are laser light sources, for example argon ion lasers and krypton ion lasers. Laser light also allows the resist to be exposed without a mask by writing the controlled laser beam directly on the resist layer. The high sensitivity of the novel materials is very advantageous here, allowing high writing speeds at relatively low intensities. This method allows the production of printed circuits in the electronics industry, lithographic offset printing plates or relief printing plates and photographic image-recording materials. The high sensitivity of the resists is also advantageous for exposure by means of DUV steppers, since very short exposure times are desired.

The process described above for the production of relief structures preferably comprises, as a further process measure, warming of the coating between exposure and treatment with the developer. With the aid of this heat treatment, known as "post-exposure bake", virtually complete reaction of the acid-sensitive groups in the polymer skeleton with the acid generated by the exposure is achieved. The duration and temperature of this post-exposure bake can vary within broad limits and depend essentially on the composition of the acid-sensitive polymer and on the type of acid generator used and on the concentration of these two components. The exposed resist is usually subjected to temperatures of about 50°–150° C. for from a few seconds to a few minutes. Surprisingly, the delay time during which no T-tops occur is significantly extended in the novel resists compared with the positive photoresist systems known hitherto, for example the positive resists described in EP-A 366 590 and EP-A 342 498.

After imagewise exposure carried out in a conventional manner and any heat treatment of the material, the exposed areas of the photoresist are removed by dissolution in a developer.

The choice of the particular developer depends on the type of photoresist, in particular on the nature of the binder used or the photolysis products formed. The developer can comprise aqueous solutions of bases to which organic solvents or mixtures thereof may have been added.

Particularly preferred developers are aqueous alkaline solutions, as also employed for the development of novolak naphthoquinone diazide resist coatings. These include, for example, aqueous solutions of alkali metal silicates, phosphates, hydroxides and carbonates, but in particular of tetraalkylammonium hydroxides, for example of tetramethylammonium hydroxide. If desired, relatively small amounts of wetting agents and/or organic solvents can also be added to these solutions.

Typical organic solvents which can be added to the developer liquids are, for example, cyclohexanone, 2-ethoxyethanol, toluene, acetone, isopropanol, ethanol, and mixtures of two or more of these solvents.

Apart from the greatly reduced delay time effects and the other advantages mentioned above, the novel resist compositions are distinguished, inter alia, by good applicational properties and high optical transparency, high thermal stability and very good resolution (submicron region).

After the development step, the substrate carrying the imagewise-structured coating is generally subjected to at least one further treatment step, at least on the exposed side, which results in a change in the substrate in the free areas of the substrate. This may be followed, as an additional process measure, by removal of the structured resist coating from the substrate.

The invention furthermore relates to a process for the production of an electronic component which includes a process for treating a subswam as described above.

The invention furthermore relates to protective coatings and relief structures produced using the novel photoresist compositions.

EXAMPLE 1

Preparation of tert-butyl 4-vinylphenoxyacetate.

59.3 g (430 mmol) of potassium carbonate, 0.64 g of potassium iodide, 50.7 g (260 mmol) of tert-butyl bromoacetate and 31.2 g (260 mmol) of 4-hydroxystyrene are mixed with 145 ml of acetone in a 750 ml sulfonation flask. The resultant suspension is refluxed for 100 minutes, cooled, filtered and evaporated. The residue obtained is taken up in 750 ml of ether and washed twice with 100 ml of 1N NaOH solution in each case and then twice with 200 ml of water in each case. The organic phase is separated off, dried over magnesium sulfate and evaporated, leaving 60.02 g (256 mmol) of the desired product as a clear oil, which corresponds to a yield of 98.5% of theory. $^1$H-NMR (CDCl$_3$, 300 MHz): δ ppm] 7.33/d/2H of the resultant product 6,84/d/2H 6,64/dd/1H 5,60/d/1H 5,12/d/1H 4,49/s/2H 1,47/s/9H

EXAMPLE 2

Preparation of a copolymer of tert-butyl 4-vinylphenoxyacetate and N-hydroxymeth ylmale imide.

8.0 g (34.1 mmol) of tertobutyl 4-vinylphenoxyacetate, 4.3 g (34.1 mmol) of N-hydroxymethylmaleimide, 0.25 g of azobisisobutyronitrile and 0.43 g of 1-dodecyl thiol are dissolved in 86 ml of diglyme in a 150 ml sulfonation flask which has been dried by flame treatment. After the flask has been flushed three times with nitrogen, the reactants are allowed to react for 2 hours at 75° C., and the product is then precipitated in 1 liter of n-hexane. The resultant white precipitate is dried, dissolved in 40 ml of tetrahydrofuran and precipitated from 500 ml of isopropanol. Drying gives 7.6 g of a white powder (62% of theory).

$^1$H-NMR (acetone-$d_6$, 300 MHz): δ[ppm] 6.8 of the resultant product 5.2 4.8 4.6 4.0–1.7 1.5

GPC (polystyrene calibration): $M_w$ 19,100 $M_n$ 8,650 PD 2.2

TGA (10° C./min): 24.5% weight loss between 160° and 220° C.

EXAMPLE 3

Preparation of a terpolymer of tert-butyl 4-vinylphenoxyacetate, N-hydroxymethylmaleimide and N-(acetoxymethyl) maleimide.

Analogously to Example 2, 35.15 g (150 retool) of tert-butyl 4-vinylphenoxyacetate, 4.19 g (33 mmol) of N-hydroxymethylmaleimide, 19.77 g (117 mmol) of N-(acetoxymethyl)maleimide, 0.6 g of azobisisobutyronitrile and 2.1 g of 1-dodecyl thiol, dissolved in 400 ml of diglyme, were reacted to give 49.44 g of a white powder (83% of theory).

$^1$H-NMR (acetone-$d_6$, 300 MHz): δ ppm] 7.0–6.5/m of the resultant product 5.5–5.1/m 4.9–4.4/m 2.8/s 2.0/bs 1.5/m GPC (polystyrene calibration): $M_w$ 19,150 $M_n$ 9,070 PD 2.1

TGA (10° C./min): 14% weight loss between 164 and 201° C.

EXAMPLE 4

Preparation of a copolymer of tert-butyl 4-vinylphenoxyacetate and N-(acetoxymethyl)maleimide.

Analogously to Example 2, 8.0 g (34.1 mmol) of tert-butyl 4-vinylphenoxyacetate, 6.2 g (34.1 mmol) of N-(acetoxymethyl)maleimide, 0.25 g of azobisisobutyronitrile and 0.43 g of 1-dodecyl thiol, dissolved in 86 ml of diglyme, are reacted to give 8.9 g of a white powder (63% of theory).

$^1$H-NMR (CDCl$_3$, 300 MHz): δ[ppm] 6.8 of the resultant product 5.1 4.8 4.6 4.0–1.7 2.1 1.5

GPC (polystyrene calibration): Mw 19,700 $M_n$ 8650 PD 2.3

TGA (10° C./min): 20% weight loss between 170° and 220° C.

EXAMPLE 5

Preparation of a copolymer of tetrahydro-2H-pyran-2-yl 4-ethenylbenzeneacetate and N-hydroxymethylmaleimide.

a) 5.3 g (220 mmol) of magnesium turnings are mixed with 150 ml of diethyl ether under an inert nitrogen atmosphere in a 250 ml three-neck round-bottom flask. 30.5 g (200 mmol) of vinylbenzyl chloride are then added, and the mixture is refluxed for 1 hour. $CO_2$ is then passed into the suspension, cooled to 5° C., until no exothermicity can be detected with the aid of a thermometer (about 9 g). The mixture is then poured into 400 ml of 1N hydrochloric acid and extracted twice with ether. The combined ether phases are then washed with 500 ml of water, dried over magnesium sulfate and evaporated. The resultant oil is recrystallized from a mixture of 50 ml of toluene and 150 ml of n-hexane, giving 7.1 g (22% of theory) of 4-vinylphenylacetic acid as a white powder of melting point 94° C.

$^1$H-NMR (CDCl$_3$, 300 MHz): δ [ppm]11.5–11.0/s/1H 7.4–7.1/m/4H 6.67/dd/1H 5.72/dd/1H 5.23/dd/1H 3.59/s/2H b) A mixture of 7 g (43 mmol) of 4-vinylphenylacetic acid, 12.0 g (142 mmol) of 3,4-dihydro-2H-pyran and 2 drops of 32% hydrochloric acid is warmed at 45° C. for 90 minutes in a 50 ml three-necked round-bottom flask fitted with magnetic stirrer and nitrogen blanketing system. 100 ml of ether are then added. The organic phase is then washed twice with 50 ml of 1 N sodium hydroxide solution in each case and twice with 50 ml of water in each case, dried over magnesium sulfate and evaporated, giving a colourless oil, which is recrystallized from three times the amount of n-hexane, giving 7.5 g (70% of theory) of tetrahydro-2H-pyran-2-yl 4-vinylphenylacetate having a melting point of 34° C. $^1$H-NMR (CDCl$_3$, 300 MHz): δ [ppm] 7.4–7.1/m/4H 6.68/dd/1H 5.98/dd/1H 5.73/dd/1H 5.22/dd/1H –3.7/m/2H 3.64/s/2H 1.9–1.5/m/6H c) 4.9 g (20 mmol) of tetrahydro-2H-pyran-2-yl 4-vinylphenylacetate, 2.5 g (20 mmol) of N-hydroxymethylmaleimide, 0.15 g of azobisisobutyronitrile and 0.26 g of 1-dodecane thiol are mixed with 52 g diglyme in a 100 ml round-bottom flask. The mixture is heated at 75° C. for 2 hours and subsequently precipitated from 600 ml of isopropanol. The white precipitate is filtered off, dissolved in 50 ml of THF and again precipitated from 600 ml of isopropanol. Drying of the precipitate gives 3.4 g (46% of theory) of the desired copolymer.

$^1$H-NMR (CDCl$_3$, 300 MHz): δ [ppm] 7.5–6.8 6.0–5.6 5.2–4.4 3.9–1.5

GPC (polystyrene calibration): $M_w$ 18,500 $M_n$ 9300

TGA (10° C./min): 31% weight loss between 100° and 200° C.

EXAMPLE 6

Application of the terpolymer from Example 3.

3.84 g of the terpolymer from Example 3 together with 0.16 g of triphenylsulfonium trifluoromethylsulfonate (prepared by the method of J. L. Dektar and N. P. Hacker, JACS 112 (1990), p. 6004) are dissolved in 16 g of 1-methoxy-2-propyl acetate. After microfiltration (0.2 µm), the resultant solution is spin-coated onto a 100 mm silicon wafer so that, after drying for 60 seconds at 120° C. on a hotplate, a resist film having a thickness of 850 nm remains on the wafer. The subsequent exposure is carded out by means of a 5:1 projection exposer (Canon FPA 4500, N. A. 0.37) using radiation having a wavelength of 248 nm, with the exposure dose being increased in steps of 0.5 ml/cm$^2$. The sample is then heated on a hotplate at 100° C. for 60 seconds and then developed for 60 seconds in aqueous 0.262N tetramethylammonium hydroxide solution (TMAH).

At an exposure dose of 6 mJ/cm$^2$, positive images of test structures can be obtained, with a resolution of 0.35 µm (lines and spaces) being achieved.

EXAMPLE 7

Application of the copolymer from Example 2

3.84 g of the copolymer from Example 2 together with 0.16 g of triphenylsulfonium trifluoromethylsulfonate are dissolved in 1-methoxy-2-propyl acetate and applied to a 100 mm silicon wafer as in Example 6. The resist film thickness is 859 nm. After exposure carded out as in Example 6, heating of the sample at 90° C. for 60 seconds and development for 60 seconds in aqueous 0.0262N tetramethylammonium hydroxide solution (TMAH), it is found that image-accurate positive resist structures can be obtained with a resolution of 0.30 µm on exposure to a radiation dose of 13 mJ/cm$^2$.

EXAMPLE 8

Application of the copolymer from Example 4.

3.84 g of the copolymer from Example 2 together with 0.16 g of triphenylsulfonium trifluoromethylsulfonate are dissolved in 16 g of 1-methoxy-2-propyl acetate and applied to a 100 mm silicon wafer as in Example 6. The resist film thickness is 850 nm. The remainder of the procedure as in Example 6 is then followed. It is found that image-accurate positive submicron structures can be imaged on exposure to a radiation dose of 42 mJ/cm$^2$.

EXAMPLE 9

Preparation of a copolymer of tert-butyl 2-methyl-2-(4-vinylphenoxy)propionate and N-hydroxymethylmaleimide.

Analogously to Example 2, 9.0 g (34 mmol) of tert-butyl 2-methyl-2-(4-vinylphenoxy)propionate, 4.8 g (38 mmol) of N-hydroxymethylmaleimide, 0.3 g of azobisisobutyronitrile and 0.52 g of 1-dodecyl thiol, dissolved in 100 ml of diglyme, are reacted to give 11.6 g of a white powder (80% of theory).

$^1$H-NMR (CDCl$_3$, 300 MHz): δ ppm) 6.7 of the resultant product 4.8 3.8–1.1

GPC (polystyrene calibration): M$_w$ 14,030 M$_n$ 6,750 PD 2.0

TGA (10° C./min): 22% weight loss between 160° and 220° C. DSC (10° C./min): Tg=127° C.

EXAMPLE 10

Preparation of a terpolymer of tert-butyl 2-methyl-2-(4-vinylphenoxy)propionate, N-hydroxymethylmaleimide and N-(acetoxymethyl)maleimide.

Analogously to Example 2, 35 g (133 mmol) of tert-butyl 2-methyl-2-(4-vinylphenoxy)propionate, 8.45 g (66 mmol) of N-hydroxymethylmaleimide, 11.25 g (67 mmol)of N-(acetoxymethyl)maleimide, 1.1 g of azobisisobutyronitrile and 1.9 g of 1-dodecyl thiol, dissolved in 380 ml of diglyme, are reacted to give 47.3 g of a white powder (86% of theory).

$^1$H-NMR (CDCl$_3$, 300 MHz): δ [ppm] 6.7 of the resultant product 5.25 4.8 3.8–1.1

GPC (polystyrene calibration): M$_w$ 15,220 M$_n$ 5,800 PD 2.6

TGA (10° C./min): 13% weight loss between 180° and 220° C.

EXAMPLE 11

Preparation of a terpolymer of tert-butyl 4-vinylphenoxyacetate, maleimide and N-(acetoxymethyl)maleimide.

Analogously to Example 2, 15.05 g (64 mmol) of tert-butyl 4-vinylphenoxyacetate, 3.12 g (32 mmol) of maleimide, 5.43 g (32 mmol) of N-(acetoxymethyl)maleimide, 0.47 g of azobisisobutyronitrile and 0.83 g of 1-dodecyl thiol, dissolved in 165 ml of diglyme, are reacted to give 11.7 g of a white powder (49% of theory).

$^1$H-NMR (CDCl$_3$, 300 MHz): δ [ppm] 6.7 of the resultant product 5.3 4.5 3.5–1.2

GPC (polystyrene calibration): M$_w$ 16,220 M$_n$ 9,900 PD 1.64

TGA (10° C./min): 15% weight loss between 170° and 220° C.

EXAMPLE 12

Preparation of a terpolymer of tert-butyl 4-vinylbenzeneacetate, N-hydroxymethylmaleimide and N-(acetoxymethyl)maleimide.

Analogously to Example 2, 9.0 g (41 mmol) of tert-butyl 4-vinylbenzeneacetate, 2.62 g (20 mmol) of N-hydroxymethylmaleimide, 3.49 g (21 mmol) of N-(acetoxymethyl)maleimide, 0.30 g of azobisisobutyronitrile and 0.53 g of 1-dodecyl thiol, dissolved in 106 ml of diglyme, are reacted to give 14.4 g of a white powder (95% of theory).

$^1$H-NMR (CDCl$_3$, 300 MHz): δ [ppm] 7.1 of the resultant product 5.3 4.8 3.7–1.2

GPC (polystyrene calibration): M$_w$ 12,540 M$_n$ 5,240 PD 2.39

TGA (10° C./min): 18% weight loss between 170° and 230° C.

EXAMPLE 13

Preparation of a copolymer of tert-butyl 4-vinylbenzeneacetate and N-hydroxymethylmaleimide.

Analogously to Example 2, 1.5 g (6.9 mmol) of tert-butyl 4-vinylbenzeneacetate, 0.87 g (6.9 mmol) of N-hydroxymethylmaleimide, 0.05 g of azobisisobutyronitrile and 0.08 g of 1-dodecyl thiol, dissolved in 16 ml of diglyme, are reacted to give 2.25 g of a white powder (94% of theory).

$^1$H-NMR (CDCl$_3$, 300 MHz): δ [ppm] 7.0 of the resultant product 4.8 3.4-3.3–1.1

GPC (polystyrene calibration): M$_w$ 11,670 M$_n$ 4,685 PD 2.5

TGA (10° C./min): 25% weight loss between 150° and 230° C.

DSC (10° C./min): Tg=115° C.

EXAMPLE 14

Application of the terpolymer from Example 3.

A solution containing 3.84 g of the terpolymer from Example 3 and 0.16 g of triphenylsulfonium trifluoromethanesulfonate, dissolved in 16 g of 1-methoxy-2-propyl acetate, is prepared and spin-coated onto a silicon wafer analogously to Example 6. After drying at 100° C. for 60 seconds, the resist film is exposed imagewise using a GCA XLS projection exposer (N. A. 0.53) with 60 dose units at a wavelength of 248 nm. The silicon wafer is subsequently heated at 90° C. for 60 seconds and then developed for 2 minutes in an aqueous 0.131N tetramethylammonium hydroxide solution. Positive structures are imaged dimensionally accurately and without leaving a residue down to 0.25 microns (lines/spaces).

EXAMPLE 15

Preparation of 2-(4-vinylphenoxy)-2-methoxypropane.

72.1 g (600 mmol) of 4-hydroxystyrene are dissolved in a mixture of 300 ml of diethyl ether and 150 ml of dioxane under a nitrogen atmosphere in a 1500 ml sulfonation flask. 216.3 g (3000 mmol) of 2-methoxypropene are added, and the mixture is cooled to 10° C. 1,48 g (7.8 mmol) of p-toluenesulfonic acid in 28.5 g (360 mmol) of pyridine are then added dropwise in the course of 20 minutes, and the mixture is stirred at room temperature for 20 hours. The reaction mixture is washed three times with 300 ml of 0.2N NaOH and three times with 300 ml of demineralized water. The organic phase is dried using magnesium sulfate, filtered through 1 cm of Ambefiyst A27 and evaporated in a rotary evaporator. Further drying of the resultant residue under a high vacuum leaves 99.2 g (82% of theory) of the desired product in the form of a yellow oil.

$^1$H-NMR (CDCl$_3$, 300 MHz): δ [ppm] 7.30/d/2H of the resultant product 7.05/d/2H 6.67/dd/1H 5.63/d/1H 5.14/d/1H 3.41/s/3H 1.47/s/6H.

EXAMPLE 16

Preparation of a terpolymer of 2-(4-vinylphenoxy)-2-methoxypropane, N-hydroxymethylmaleimide and N-(acetoxymethyl)maleimide.

50 g (260 mmol) of 2-(4-vinylphenoxy)-2-methoxypropane, 17 g (130 mmol) of N-hydroxymethylmaleimide, 22 g (130 mmol) of N-(acetoxymethyl)maleimide, 3.1 g of 1-dodecyl thiol, 1.8 g of (4-morpholinobenzoyl)-1-benzyl-1-dimethylaminopropane (Irgacure® 369) and 600 g of tetrahydrofuran are introduced under a yellow light into a 1000 ml sulfonation flask which has been dried by flame treatment. The resultant solution is degasseal three times with argon and then exposed for 1 hour using a UV lamp (500 W Oriel-Ushio mercury lamp). After the exposure, the reaction mixture is stirred at room temperature for 1 hour, and the product is precipitated in 800 ml of methanol. Drying at 40° C. in vacuo gives 54.5 g of a white powder (61% of theory).

$^1$H-NMR (acetone-d$_6$, 300 MHz): δ [ppm] 6.7 of the resultant product 5.25 4.8 3.8–2 1.4

GPC (polystyrene calibration): M$_w$ 31,600 M$_n$15,100 PD 2.1

TGA (10° C./min): 25.1% weight loss between 130 and 220° C.

EXAMPLE 17

Preparation of 1-(4-vinylphenoxy)-1-tert-butoxyethane. 12.02 g (100 mmol) of 4-hydroxystyrene, 0.09 g of p-toluenesulfonic acid and 100 ml of diethyl ether are introduced under a nitrogen atmosphere into a 250 ml three-neck flask. The mixture is cooled to between 0° and 5° C., and 11.02 g (110 mmol) of tert-butyl vinyl ether are added dropwise at this temperature over the course of 15 minutes. The mixture is then stirred at 10° C. for 2 hours. The reaction mixture is washed three times with 150 ml of 1N NaOH and three times with demineralized water. Stripping off of the solvent gives 16 g (72% of theory) of the desired product in the form of a yellow oil.

1H-NMR (CDCl$_3$, 300 MHz): δ [ppm] 7.3 1/d/2H of the resultant product 6.90/d/2H 6.64/dd/1H 5.55/m/2H 5.12/d/1H 1.44/d/3H 1.24/s/9H.

EXAMPLE 18

Preparation of a terpolymer of 1-(4-vinylphenoxy)-1-tert-butoxyethane, N-hydroxymethylmaleimide and N-(acetoxymethyl)maleimide.

7.5 g (34 mmol) of 1-(4-vinylphenoxy)-1-tert-butoxyethane, 1.3 g (10.2 mmol) of N-hydroxymethylmaleimide, 4.0 g (23.8 mmol) of N-(acetoxymethyl)maleimide, 0.26 g of azobisisobutyronitrile, 0.45 g of 1-dodecyl thiol and 90 g of diglyme are introduced into a round-bottom flask which has been dried by flame treatment. The resultant solution is degassed three times with nitrogen and then stirred at a temperature of 75° C. for 2 hours. The product is then precipitated in 900 ml of diethyl ether. The precipitated product is filtered off, dried, dissolved in 60 ml of acetone and precipitated in 700 ml of diethyl ether. Re-filtration and drying under a high vacuum give 6.76 g of a white powder (52% of theory).

$^1$H-NMR (acetone-d$_6$, 300 MHz): δ ppm] 6.8 of the resultant product 5.5–5.0 2.0 1.6 1.25

GPC (polystyrene calibration): M$_w$ 44,200 M$_n$ 20,600 PD 2.1

TGA (10° C./min): 27.8% weight loss between 140° and 230° C.

What is claimed is:

1. A radiation-sensitive composition useful as a positive photoresist comprising a) at least one compound which forms an acid on exposure to actinic radiation; and b) at least one polymer which comprises recurring structural units selected from the group consisting of at least one structural unit of formulae (Ia) and (Ib):

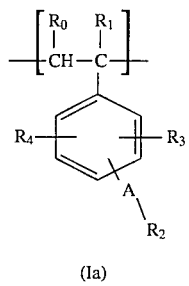

(Ia)

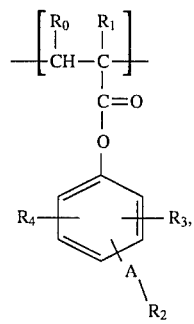

(Ib)

and, in addition to these structural units, recurring structural units of the formula (II)

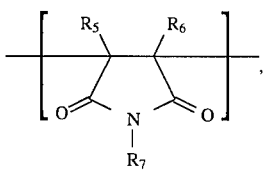
(II)

where

A is a direct single bond or a divalent group of the formula —O—;

R$_0$ and R$_1$, independently of one another, are each a hydrogen atom, a C$_1$–C$_6$alkyl group or an aryl group having 6 to 14 ring carbon atoms;

R$_2$ is a radical of the formula

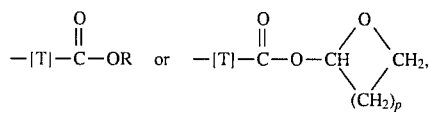

in which

[T] is a C$_1$–C$_6$alkylene group or an arylene group having 6 to 14 ring carbon atoms, R is a tert-alkyl radical having 4 to 19 carbon atoms or a group of the formula

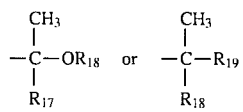

and p is the number 2, 3 or 4; or

A together with R$_2$ is a group of the formula

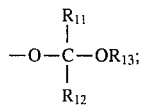

and where, furthermore,

R$_3$ and

R$_4$, independently of one another, are each a hydrogen atom, a halogen atom, a C$_1$–C$_6$alkyl group or a C$_1$–C$_6$alkoxy group;

R$_5$ and

R$_6$, independently of one another, are each a hydrogen atom, a C$_1$–C$_6$alkyl group or an aryl group having 6 to 14 ring carbon atoms, and R$_7$ is selected from the group consisting of

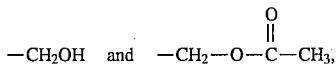
—CH$_2$OH  and  —CH$_2$—O—C—CH$_3$,

R$_{11}$ and

R$_{12}$, independently of one another, are each a hydrogen atom, a C$_1$–C$_6$alkyl group, a cycloalkyl group having 3 to 6 ring carbon atoms or an aryl group having 6 to 10 ring carbon atoms, where aryl groups are either unsubstituted or have one or more substituents selected from halogen atoms, C$_1$–C$_4$alkyl and C$_1$–C$_4$alkoxy groups and —CN and —NO$_2$;

R$_{13}$ is a C$_1$–C$_6$alkyl group, a cycloalkyl group having 3 to 6 ring carbon atoms or an aryl group having 6 to 10 ring carbon atoms, where aryl groups are either unsubstituted or have one or more substituents selected from halogen atoms, C$_1$–C$_4$alkyl and C$_1$–C$_4$alkoxy groups and —CN and —NO$_2$; and R$_{17}$ is a hydrogen atom or a C$_1$–C$_4$alkyl group;

R$_{18}$ is a C$_1$–C$_6$alkyl group or a C$_3$–C$_6$cycloalkyl group, and

R$_{19}$ is an aryl group having 6 to 14 ring carbon atoms.

2. A composition according to claim 1 comprising, as a further component c), a solvent or solvent mixture.

3. A composition according to claim 1, comprising, as component a), at least one compound of the formula (IV):

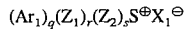
(Ar$_1$)$_q$(Z$_1$)$_r$(Z$_2$)$_s$S$^\oplus$X$_1^\ominus$  (IV)

in which

Ar$_1$ is phenyl, naphthyl or phenyl-COCH$_2$—, wherein the aryl groups are either unsubstituted or have one or more substituents selected from the group consisting of halogen atoms, C$_1$–C$_4$alkyl-, C$_1$–C$_4$alkoxy-, hydroxyl- and nitro groups, Z$_1$ is C$_1$–C$_6$alkyl or C$_3$–C$_7$cycloalkyl, and Z$_2$ is tetrahydrothienyl, tetrahydrofuryl or hexahydropyryl, q is 0, 1, 2 or 3, r is 0, 1 or 2 and s is 0 or 1, where the sum q+r+s is 3, and X$_1^-$ is a chloride, bromide or iodide anion, BF$_4^\ominus$, PF$_6^\ominus$, AsF$_6^\ominus$, SbF$_6^\ominus$, FSO$^\ominus$ or the anion of an organic sulfonic acid or carboxylic acid.

4. A composition according to claim 3, in which

Ar$_1$ is phenyl, q is the number 3, r and s are zero, and

X$_1^\ominus$ is SbF$_6^\ominus$, AsF$_6^\ominus$, PF$_6^\ominus$, CF$_3$SO$_3^\ominus$, C$_2$F$_5$SO$_3^\ominus$, n-C$_3$F$_7$SO$_3^\ominus$, n-C$_4$F$_9$SO$_3^\ominus$, n-C$_6$F$_{13}$SO$_3^\ominus$, n-C$_8$F$_{17}$SO$_3^\ominus$ or C$_6$F$_5$SO$_3^\ominus$.

5. A composition according to claim 3, in which component a) is triphenylsulfonium trifluoromethanesulfonate.

6. A composition according to claim 1, comprising 0.1–20% by weight of component a), based on the weight of component b).

7. A composition according to claim 1 comprising b) at least one polymer as defined in claim 1 which has a molecular weight (weight average) M$_w$ of from 1000 to 1,000,000 measured by gel permeation chromatography.

8. A composition according to claim 1 comprising (b) at least one polymer which comprises recurring structural units of the formula (Ia) and of the formula (II), where A is the —O— group;

R$_0$ is a hydrogen atom and

R$_1$ is a hydrogen atom or a C$_1$–C$_6$alkyl group;

R$_2$ is a radical of the formula

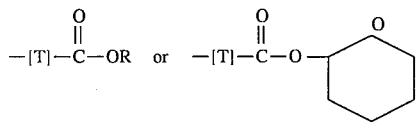

in which

R is a tert-alkyl radical having 4 to 19 carbon atoms, and

[T] is a C$_1$–C$_6$alkylene group;

R$_3$ and

R$_4$, and

R$_5$ and

R$_6$, independently of one another, are in each case a hydrogen atom or a C$_1$–C$_6$alkyl group; or A together with R$_2$ is a group of the formula

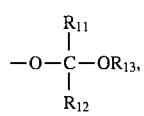

in which

R$_{11}$ and

R$_{12}$ and

R$_{13}$ have the same meaning as in claim 1.

9. A composition according to claim 8, in which

R$_1$ is a hydrogen atom;

R$_2$ is a radical of the formula

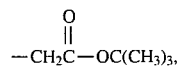
—CH$_2$C—OC(CH$_3$)$_3$,

R$_3$ and

R$_4$, and

R$_5$ and

R$_6$ are a hydrogen atom.

10. A composition according to claim 1 comprising b) at least one polymer as defined in claim 1, in which the average numerical ratio between structural units of the formulae (Ia) and/or (Ib) and structural units of formula (II) in the molecule is from 5:1 to 1:1.

11. A composition according to claim 1, in which

R$_7$ is

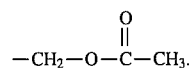
—CH$_2$—O—C—CH$_3$.

* * * * *